(12) United States Patent
Je et al.

(10) Patent No.: US 10,145,012 B2
(45) Date of Patent: Dec. 4, 2018

(54) SUBSTRATE PROCESSING APPARATUS AND SUBSTRATE PROCESSING METHOD

(71) Applicant: EUGENE TECHNOLOGY CO., LTD., Yongin-si, Gyeonggi-do (KR)

(72) Inventors: Sung-Tae Je, Yongin-si (KR); Gil Sun Jang, Icheon-si (KR); Chang-Hoon Yun, Namyangju-si (KR); Kyong-Hun Kim, Yongin-si (KR)

(73) Assignee: EUGENE TECHNOLOGY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/038,672

(22) PCT Filed: Dec. 10, 2014

(86) PCT No.: PCT/KR2014/012124
§ 371 (c)(1),
(2) Date: May 23, 2016

(87) PCT Pub. No.: WO2015/102256
PCT Pub. Date: Jul. 9, 2015

(65) Prior Publication Data
US 2016/0289831 A1    Oct. 6, 2016

(30) Foreign Application Priority Data

Jan. 3, 2014    (KR) .................... 10-2014-0000563

(51) Int. Cl.
*C23C 16/455*    (2006.01)
*C23C 16/52*    (2006.01)
(Continued)

(52) U.S. Cl.
CPC .... *C23C 16/45565* (2013.01); *C23C 16/4412* (2013.01); *C23C 16/458* (2013.01); *C23C 16/52* (2013.01)

(58) Field of Classification Search
CPC ............. C23C 16/45565; C23C 16/52; C23C 16/4412; C23C 16/458
(Continued)

(56) References Cited

U.S. PATENT DOCUMENTS 5,500,256 A * 3/1996 Watabe ............. C23C 16/45561
                                                            118/715
5,884,009 A * 3/1999 Okase ............... H01L 21/67017
                                                            219/405
(Continued)

FOREIGN PATENT DOCUMENTS

KR    10-0887447 B1    3/2009
KR    10-1110080 B1    3/2012
(Continued)

*Primary Examiner* — Rudy Zervigon
(74) *Attorney, Agent, or Firm* — Rabin & Berdo, P.C.

(57) ABSTRACT

Provided is a substrate processing apparatus. The substrate processing apparatus includes a lower chamber having an opened upper side, an upper chamber opening or closing the upper side of the lower chamber, the upper chamber defining an inner space, in which a process is performed on a substrate, together with the lower chamber, a showerhead disposed on a lower portion of the upper chamber to supply a reaction gas toward the inner space, wherein a buffer space is defined between the showerhead and the upper chamber, a partition member disposed in the buffer space to partition the buffer space into a plurality of diffusion regions, and a plurality of gas supply ports disposed in the upper chamber to supply the reaction gas toward each of the diffusion regions.

11 Claims, 8 Drawing Sheets

(51) Int. Cl.
*C23C 16/44* (2006.01)
*C23C 16/458* (2006.01)

(58) Field of Classification Search
USPC .................. 118/715; 156/345.33, 345.34
See application file for complete search history.

(56) References Cited

U.S. PATENT DOCUMENTS

| | | | | |
|---|---|---|---|---|
| 5,950,925 A * | 9/1999 | Fukunaga | C23C 16/45512 | 118/715 |
| 5,958,140 A * | 9/1999 | Arami | C23C 16/45502 | 118/715 |
| 6,123,775 A * | 9/2000 | Hao | C23C 16/45572 | 118/715 |
| 6,245,192 B1* | 6/2001 | Dhindsa | C23C 16/455 | 156/345.34 |
| 6,415,736 B1* | 7/2002 | Hao | H01L 21/67017 | 118/723 E |
| 6,533,867 B2* | 3/2003 | Doppelhammer | C23C 16/45565 | 118/715 |
| 6,872,258 B2* | 3/2005 | Park | C23C 16/45565 | 118/715 |
| 7,658,800 B2* | 2/2010 | Chen | C23C 16/45565 | 118/715 |
| 7,708,859 B2* | 5/2010 | Huang | C23C 16/45561 | 118/715 |
| 8,216,418 B2* | 7/2012 | Patrick | H01J 37/32541 | 118/723 R |
| 8,277,888 B2* | 10/2012 | Dedontney | B01J 19/0046 | 118/50 |
| 8,343,876 B2* | 1/2013 | Sadjadi | H01J 37/32091 | 118/715 |
| 8,397,668 B2* | 3/2013 | Kobayashi | H01J 37/32082 | 118/715 |
| 8,430,962 B2* | 4/2013 | Masuda | C23C 16/45561 | 118/663 |
| 8,443,756 B2* | 5/2013 | Fischer | C23C 16/45565 | 118/723 E |
| 8,506,713 B2* | 8/2013 | Takagi | C23C 16/409 | 118/715 |
| 8,539,908 B2* | 9/2013 | Takagi | C23C 16/45521 | 118/695 |
| 8,551,248 B2* | 10/2013 | Goodlin | C23C 16/45565 | 118/715 |
| 8,551,890 B2* | 10/2013 | Goodlin | C23C 16/45565 | 118/715 |
| 8,668,775 B2* | 3/2014 | Moshtagh | C23C 16/45504 | 118/715 |
| 8,679,255 B2* | 3/2014 | Masuda | C23C 16/45561 | 118/663 |
| 8,733,282 B2* | 5/2014 | Kobayashi | H01J 37/32082 | 118/715 |
| 8,771,418 B2* | 7/2014 | Je | C23C 16/45565 | 118/715 |
| 8,906,160 B2* | 12/2014 | Endo | C23C 16/45544 | 118/715 |
| 9,055,661 B2* | 6/2015 | Tanaka | H05H 1/46 | |
| 9,460,893 B2* | 10/2016 | Kawamata | H01J 37/32091 | |
| 9,466,506 B2* | 10/2016 | Masuda | H01J 37/3244 | |
| 9,540,731 B2* | 1/2017 | Noorbakhsh | C23C 16/45565 | |
| 9,732,424 B2* | 8/2017 | Lee | C23C 16/45551 | |
| 9,905,400 B2* | 2/2018 | Stowell | H01J 37/32119 | |
| 10,094,019 B2* | 10/2018 | Toriya | C23C 16/45544 | |
| 2001/0010207 A1* | 8/2001 | Yamamoto | H01J 37/32192 | 118/723 MW |
| 2006/0021574 A1* | 2/2006 | Armour | C23C 16/45565 | 118/715 |
| 2006/0263522 A1* | 11/2006 | Byun | C23C 16/45519 | 427/248.1 |
| 2007/0181181 A1* | 8/2007 | Mizusawa | C23C 16/45565 | 137/1 |
| 2007/0218702 A1* | 9/2007 | Shimizu | C23C 16/06 | 438/758 |
| 2008/0078746 A1* | 4/2008 | Masuda | H01J 37/3244 | 216/79 |
| 2008/0178805 A1* | 7/2008 | Paterson | H01J 37/32091 | 118/723 I |
| 2009/0159213 A1* | 6/2009 | Bera | H01J 37/3244 | 156/345.34 |
| 2009/0162262 A1* | 6/2009 | Bera | H01J 37/3244 | 422/186.04 |
| 2009/0169744 A1* | 7/2009 | Byun | C23C 16/40 | 427/255.28 |
| 2009/0272492 A1* | 11/2009 | Katz | H01J 37/3244 | 156/345.34 |
| 2009/0275206 A1* | 11/2009 | Katz | H01J 37/3244 | 438/714 |
| 2010/0119727 A1* | 5/2010 | Takagi | C23C 16/45521 | 427/532 |
| 2010/0136216 A1* | 6/2010 | Tsuei | C23C 16/45559 | 427/9 |
| 2010/0167551 A1* | 7/2010 | DeDontney | B01J 19/0046 | 438/758 |
| 2010/0190341 A1* | 7/2010 | Park | C23C 16/045 | 438/694 |
| 2010/0243166 A1* | 9/2010 | Hayashi | H01J 37/32568 | 156/345.34 |
| 2011/0212625 A1* | 9/2011 | Toyoda | C23C 16/4412 | 438/758 |
| 2011/0256729 A1* | 10/2011 | Goodlin | C23C 16/45565 | 438/758 |
| 2011/0290419 A1* | 12/2011 | Horiguchi | H01J 37/3244 | 156/345.29 |
| 2012/0111271 A1* | 5/2012 | Begarney | C23C 16/45508 | 118/724 |
| 2012/0135145 A1* | 5/2012 | Je | C23C 16/45565 | 427/248.1 |
| 2012/0152171 A1* | 6/2012 | Lee | C23C 16/45551 | 118/730 |
| 2012/0247675 A1* | 10/2012 | Ikeda | C23C 16/45565 | 156/345.34 |
| 2013/0014895 A1* | 1/2013 | Kawamata | H01J 37/32091 | 156/345.33 |
| 2013/0149867 A1* | 6/2013 | Masuda | H01J 37/3244 | 438/695 |
| 2014/0224177 A1* | 8/2014 | Park | H01J 37/3244 | 118/730 |
| 2014/0311411 A1 | 10/2014 | Yang et al. | | |
| 2014/0370691 A1* | 12/2014 | Yamada | C30B 25/14 | 438/478 |
| 2015/0228457 A1* | 8/2015 | Yamashita | H01L 21/3065 | 216/67 |
| 2017/0047200 A1* | 2/2017 | Lee | H01J 37/3244 | |
| 2017/0283985 A1* | 10/2017 | Takahashi | C30B 25/14 | |
| 2018/0166298 A1* | 6/2018 | Kagaya | C23C 16/455 | |

FOREIGN PATENT DOCUMENTS

| | | |
|---|---|---|
| KR | 10-1130248 B1 | 3/2012 |
| KR | 10-2013-0081969 A | 7/2013 |

* cited by examiner

SUBSTRATE PROCESSING APPARATUS AND SUBSTRATE PROCESSING METHOD

TECHNICAL FIELD

The present invention disclosed herein relates to a substrate processing apparatus and a substrate processing method, and more particularly, to a substrate processing apparatus and method in which a buffer space is partitioned into a plurality of diffusion regions, and a gas supply port is disposed in each of the diffusion regions to supply a reaction gas.

BACKGROUND ART

A semiconductor device includes a plurality of layers on a silicon substrate. The layers are deposited on the substrate through a deposition process. The deposition process has several important issues that are important to evaluate the deposited layers and select a deposition method.

First, one example of the important issues is 'quality' of each of the deposited layers. The 'quality' represents composition, contamination levels, defect density, and mechanical and electrical properties. The composition of the deposited layer may be changed according to deposition conditions. This is very important to obtain a specific composition.

Second, another example of the issues is a uniform thickness over the wafer. Specifically, a thickness of a layer deposited on a pattern having a nonplanar shape with a stepped portion is very important. Here, whether the thickness of the deposited film is uniform may be determined through a step coverage which is defined as a ratio of a minimum thickness of the film deposited on the stepped portion divided by a thickness of the film deposited on the pattern.

The other issue with respect to the deposition may be a filling space. This represents a gap filling in which an insulating layer including an oxide layer is filled between metal lines. A gap is provided to physically and electrically isolate the metal lines from each other.

Uniformity is one of the important issues related to the deposition process. A non-uniform film may have a high electrical resistance on the metal line to increase possibility of mechanical damage.

DISCLOSURE

Technical Problem

The present invention provides a substrate processing apparatus and a substrate processing method which secure process uniformity.

Further another object of the present invention will become evident with reference to following detailed descriptions and accompanying drawings.

Technical Solution

Embodiments of the present invention provide a substrate processing apparatus including: a lower chamber having an opened upper side; an upper chamber opening or closing the upper side of the lower chamber, the upper chamber defining an inner space, in which a process is performed on a substrate, together with the lower chamber; a showerhead disposed on a lower portion of the upper chamber to supply a reaction gas toward the inner space, wherein a buffer space is defined between the showerhead and the upper chamber; a partition member disposed in the buffer space to partition the buffer space into a plurality of diffusion regions; and a plurality of gas supply ports disposed in the upper chamber to supply the reaction gas toward each of the diffusion regions.

In some embodiments, the diffusion region may include a central region and a plurality of edge regions, and the partition member may include: an inner partition member disposed on a circumference of the central region of the diffusion region so as to be partitioned into the central region defined in the inside thereof and the edge regions defined in the outside thereof; and a plurality of connection members connected to the outside of the inner partition member to block the edge regions against each other.

In other embodiments, the plurality of gas supply ports may be connected to the edge regions, respectively.

In still other embodiments, the diffusion region may include a central region, a plurality of intermediate regions, and a plurality of edge regions, and the partition member may include: an inner partition member disposed on a circumference of the central region of the diffusion region so as to be partitioned into the central region defined in the inside thereof and the intermediate regions defined in the outside thereof; a plurality of inner connection members connected to an outside of the inner partition member to block the intermediate regions against each other; an outer partition member spaced apart from a circumference of the inner partition member so as to be partitioned into the intermediate regions defined inside thereof and the edge regions defined outside thereof; and a plurality of outer connection members connected to the outside of the outer partition member to block the edge regions against each other.

In even other embodiments, the plurality of gas supply ports may be connected to the edge regions and the intermediate regions, respectively.

In yet other embodiments, the substrate processing apparatus may include: a plurality of gas supply lines each of which is connected to the gas supply port to supply the reaction gas; a plurality of flow rate adjustors each of which opens or closes the gas supply line; and a controller connected to the flow rate adjustor to adjust an amount of supplied reaction gas through the gas supply line.

In further embodiments, the controller may control the flow rate adjustors so that a supply amount of reaction gas supplied to one of the gas supply lines is different from that of reaction gas supplied to the other of the gas supply lines.

In still further embodiments, the partition member may be spaced apart from a bottom surface of the buffer space.

In even further embodiments, the substrate processing apparatus may include: a susceptor disposed in the inner space and on which the substrate is placed; an exhaust ring spaced apart from the lower chamber along a sidewall of the lower chamber, the exhaust ring having a plurality of exhaust holes defined above the susceptor; and a support member fixed to the sidewall of the lower chamber to support the exhaust ring, wherein an exhaust space may be defined between the sidewall of the lower chamber and the exhaust ring to communicate with an exhaust port disposed in the sidewall of the lower chamber.

In other embodiments of the present invention, a substrate processing method for processing a substrate by using a showerhead disposed in an inner space of a chamber and having a buffer space in which a reaction gas supplied from the outside is diffused, the substrate processing method including: partitioning the buffer space into a plurality of diffusion regions to adjust a supply amount of reaction gas so that an amount of reaction gas supplied into one of the diffusion regions is different from that of reaction gas supplied into the other of the diffusion regions, wherein an area of the substrate corresponding to one of the diffusion regions and an area of the substrate corresponding to the other of the diffusion regions have different degrees of processing.

In some embodiments, the buffer space may have a central region defined in a central portion of the showerhead and an edge region defined around the central region.

Advantageous Effects

According to the present invention, process uniformity may be secured.

BEST MODE

Figure 1:
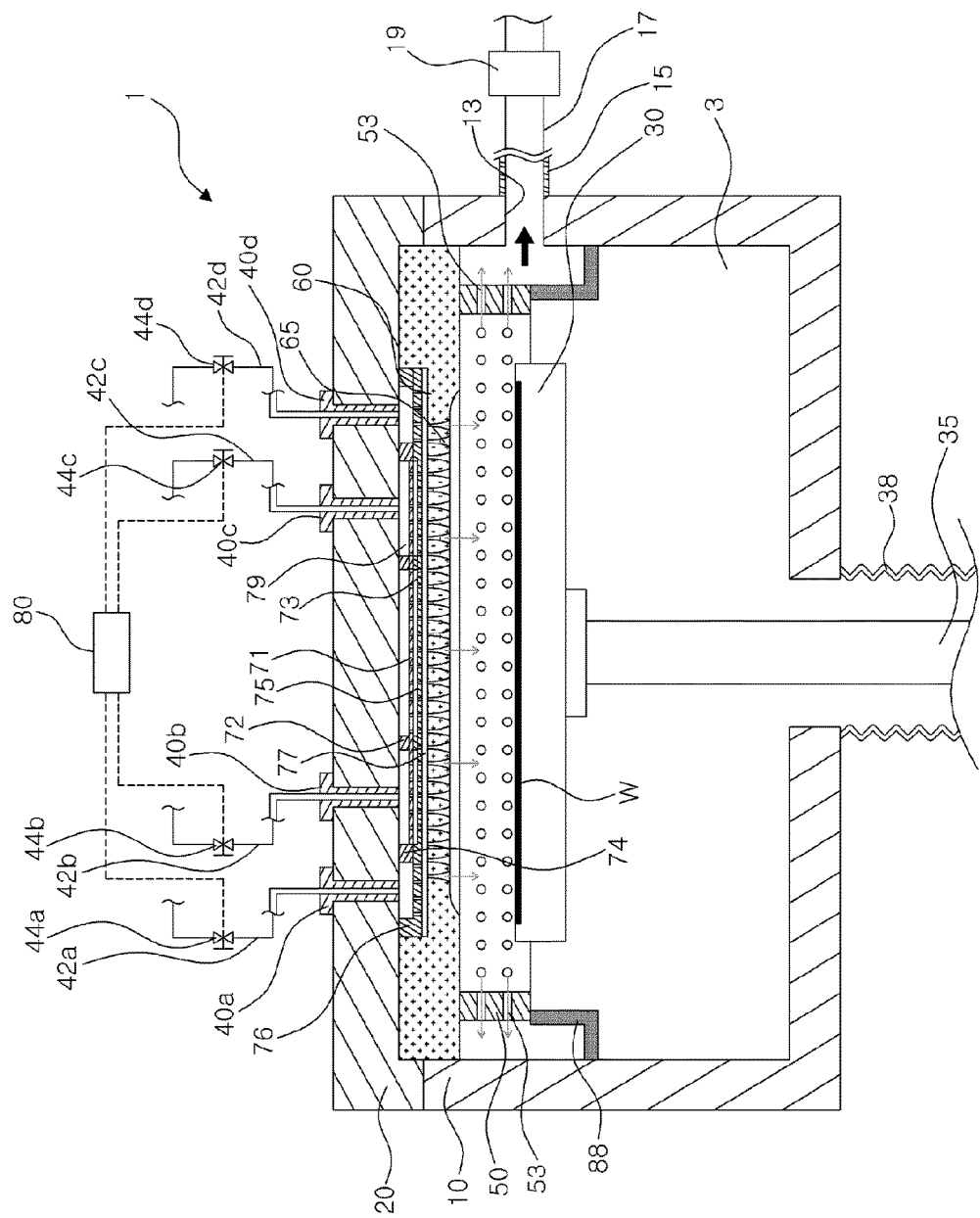
FIG. 1 is a schematic view of a substrate processing apparatus according to an embodiment of the present invention.

Hereinafter, exemplary embodiments of the present invention will be described in detail with reference to FIGS. 1 to 8. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the drawings, the shapes of components are exaggerated for clarity of illustration.

Hereinafter, although a deposition device is described as an example, the scope of the present disclosure is not limited thereto. For example, the present invention may be applied to various processes for processing a substrate by using a reaction gas.

FIG. 1 is a schematic view of a substrate processing apparatus according to an embodiment of the present invention. As illustrated in FIG. 1, a substrate processing apparatus includes a1 lower chamber 10 and an upper chamber 20. The lower chamber 10 has an opened upper side. The upper chamber 20 opens and closes the opened upper side of the lower chamber 10. When the upper chamber 20 closes the opened upper side of the lower chamber 10, the lower chamber 10 and the upper chamber 20 define an inner space 3 closed against the outside.

A susceptor 30 is disposed in the lower chamber 10. A substrate W is placed on the susceptor 30. The susceptor 30 includes a heater (not shown). The heater may heat the substrate W at a process temperature through a current applied from an external power source. A support 35 is connected to a lower portion of the susceptor 30 to support the susceptor 30. The support 35 passes through a bottom of the lower chamber 10. A bellows 38 may be disposed around the support 35 to block the inner space 3 against the outside.

A showerhead 60 is connected to a lower portion of the upper chamber 20. The showerhead 60 includes an injection part having a flat-plate shape and a flange part disposed outside the injection part and fixed to the upper chamber 20. The injection part is spaced apart from the upper chamber 20. Here, a buffer space is defined between the upper chamber 20 and the flange part. The flange part has a plurality of injection holes 65. A reaction gas supplied into the buffer space is injected into the inner space 3 through the injection holes 65. The reaction gas may include hydrogen ($H_2$), nitrogen ($N_2$), or a predetermined other inert gas. Also, the reaction gas may include a precursor gas such as silane ($SiH_4$) or dichlorosilane ($SiH_2Cl_2$). Also, the reaction gas may include a dopant source gas such as diborane ($B_2H_6$) or phosphine ($PH_3$).

Figure 4:
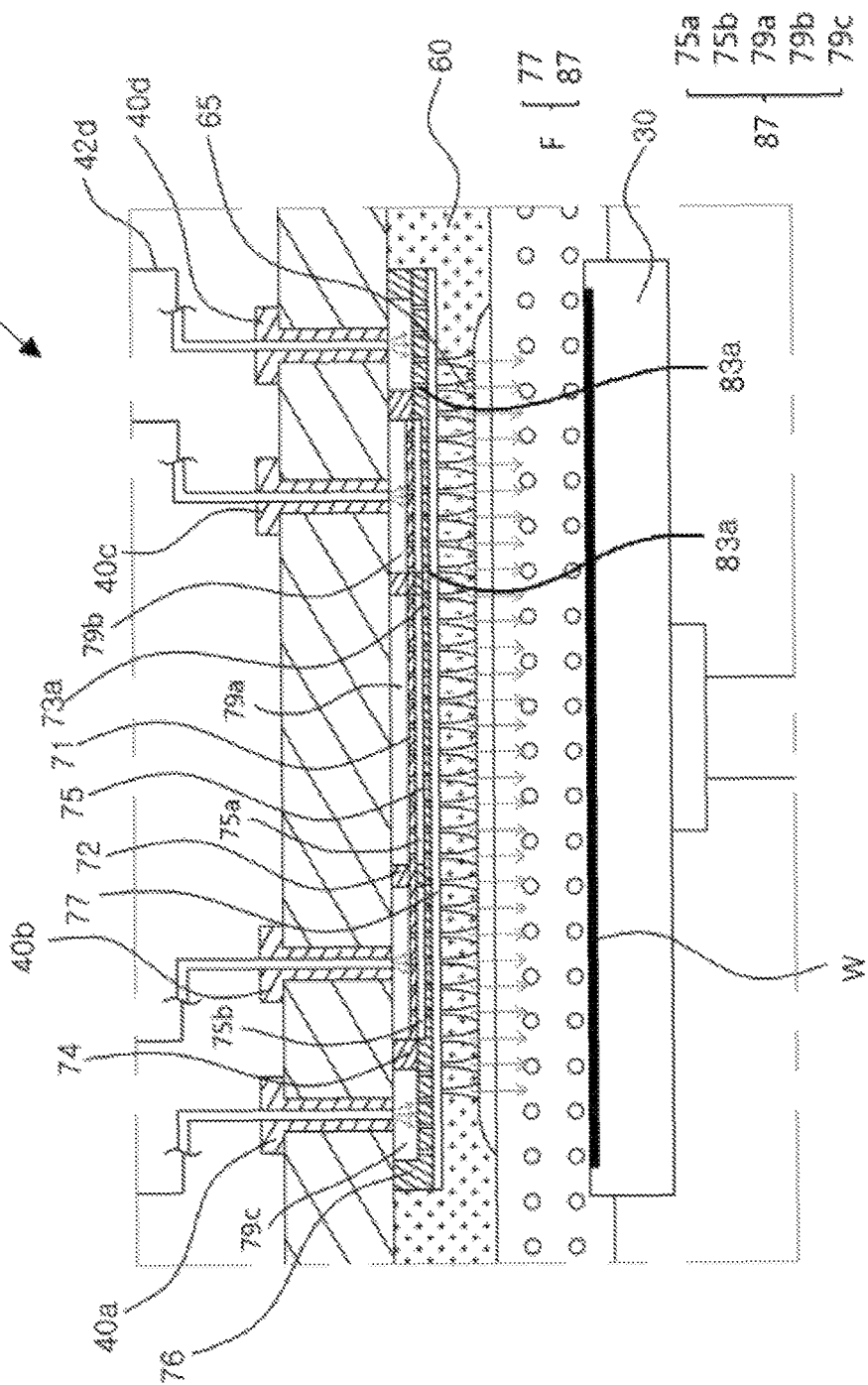
FIG. 4 is a schematic view illustrating a flow of a reaction gas of the substrate processing apparatus of FIG. 1.

Partition members may be disposed in the buffer space and fixed to the showerhead 60. The partition members may partition the buffer space into a plurality of diffusion regions F. The partition members are spaced apart from a bottom surface of the buffer space to define a lower buffer space 77 communicating with the injection holes 65 under the partition member. The lower buffer space 77 may have a size substantially the same as a diameter of the susceptor 30. An upper buffer space 87 is defined above the lower buffer space 77 and partitioned into a central region 79a and 75a, intermediate regions 79b and 75b, and edge regions 79c by the partition members. As shown in FIG. 4, the diffusion regions may include the lower buffer space 77 and the upper buffer space 87. Detailed description with respect to the partition members will be described later.

Figure 2:
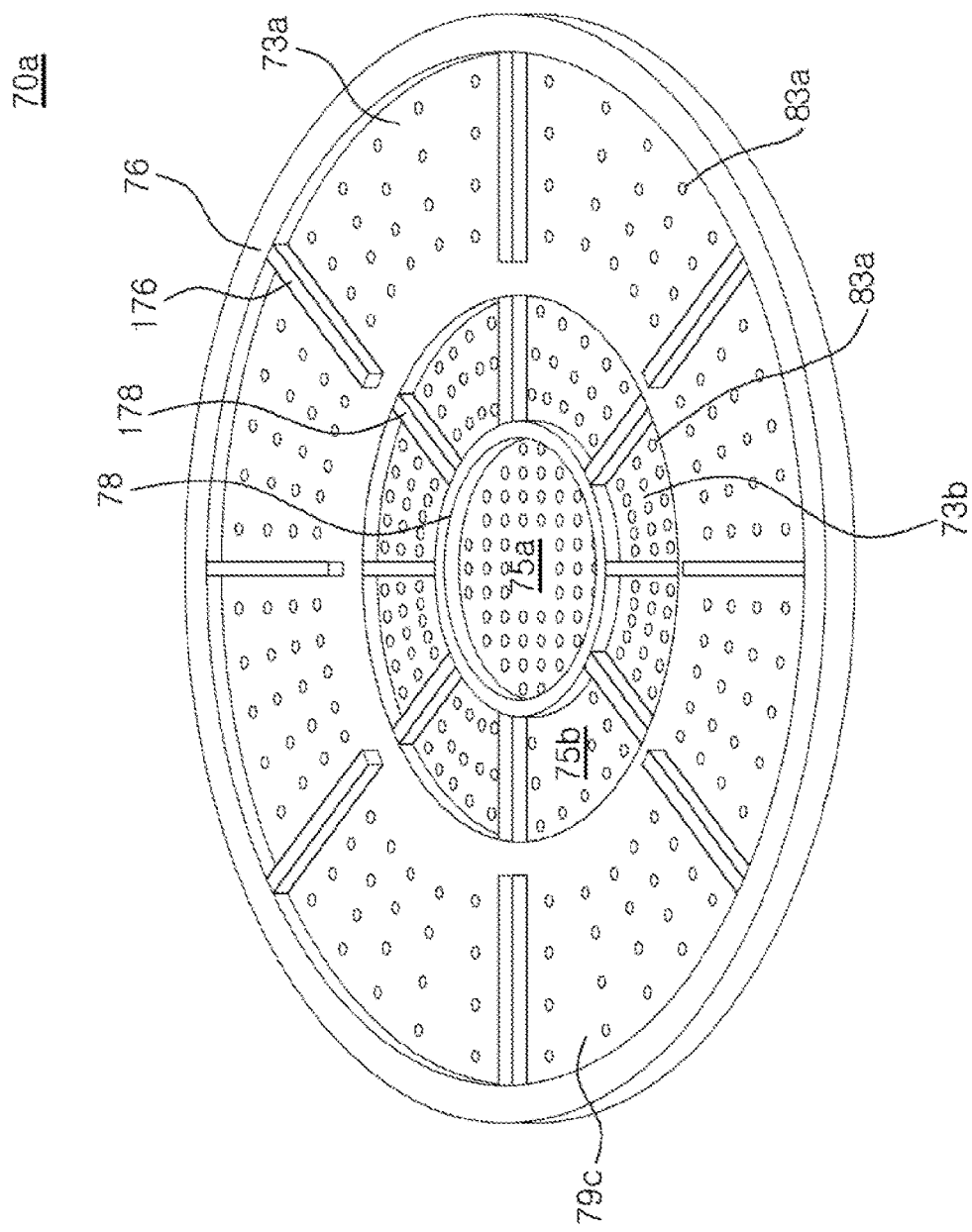
FIG. 2 is a perspective view of a lower partition member of FIG. 1.

FIG. 2 is a perspective view of a lower partition member of FIG. 1. The partition members include upper and lower partition members. The upper partition member is disposed on the lower partition member. The lower partition member 70a includes a lower plate 73a having a circular plate shape. The lower plate 73a may have a plurality of lower through-holes 83a to allow the reaction gas supplied into the upper buffer space 87 to move into the lower buffer space 77 through the lower through-holes 83a. A circular recess part 73b recessed from a top surface of the lower plate 73a is defined in a central portion of the lower plate 73a. A lower inner partition member 78 is disposed in the recess part 73b to partition a space of the recess part 73b into one circular lower central region 75a and eight fan-shaped lower intermediate regions 75b. Lower inner connection members 178 radially extend from an outer circumferential surface of the lower inner partition member 78 with respect to a center of the lower inner partition member 78. The lower inner connection members 178 contact an inner sidewall of the recess part 73b to partition the space of the recess part 73b into the eight lower intermediate regions 75b, thereby blocking the eight lower intermediate regions 75b against each other. The lower inner partition member 78 and the lower inner connection member 178 may have substantially the same thickness as a depth of the recess part 73b.

Also, a lower flange 76 is disposed along an edge of the lower plate 73a to protrude a top surface of the lower plate 73a. Lower outer connection members 176 extend from an inner sidewall of the lower flange 76 toward the center of the lower inner partition member 78 in the radial direction. Each of the lower outer connection members 176 is spaced apart from the inner sidewall of the recess part 73b. An upper outer partition member 74 that will be described later is disposed between the lower outer connection member 176 and the lower inner connection member 178. Here, a distance between the lower outer connection member 176 and the inner sidewall of the recess part 73b may substantially the same as a width of the upper outer partition member 74. When the upper outer partition member 74 is disposed on the lower plate 73a as illustrated in FIG. 1, eight fan-shaped edge regions 79c are defined outside the upper outer partition member 74. The lower outer connection members 176 may partition a space of the lower plate 73a into the eight edge regions 79c to block the eight edge regions 79c against each other. The lower outer connection member 176 has a height substantially the same as that of the lower flange 76. Also, as illustrated in FIG. 2, the recess part 73b, the lower inner partition member 78, and the lower flange 76 are concentrically disposed.

Figure 3:
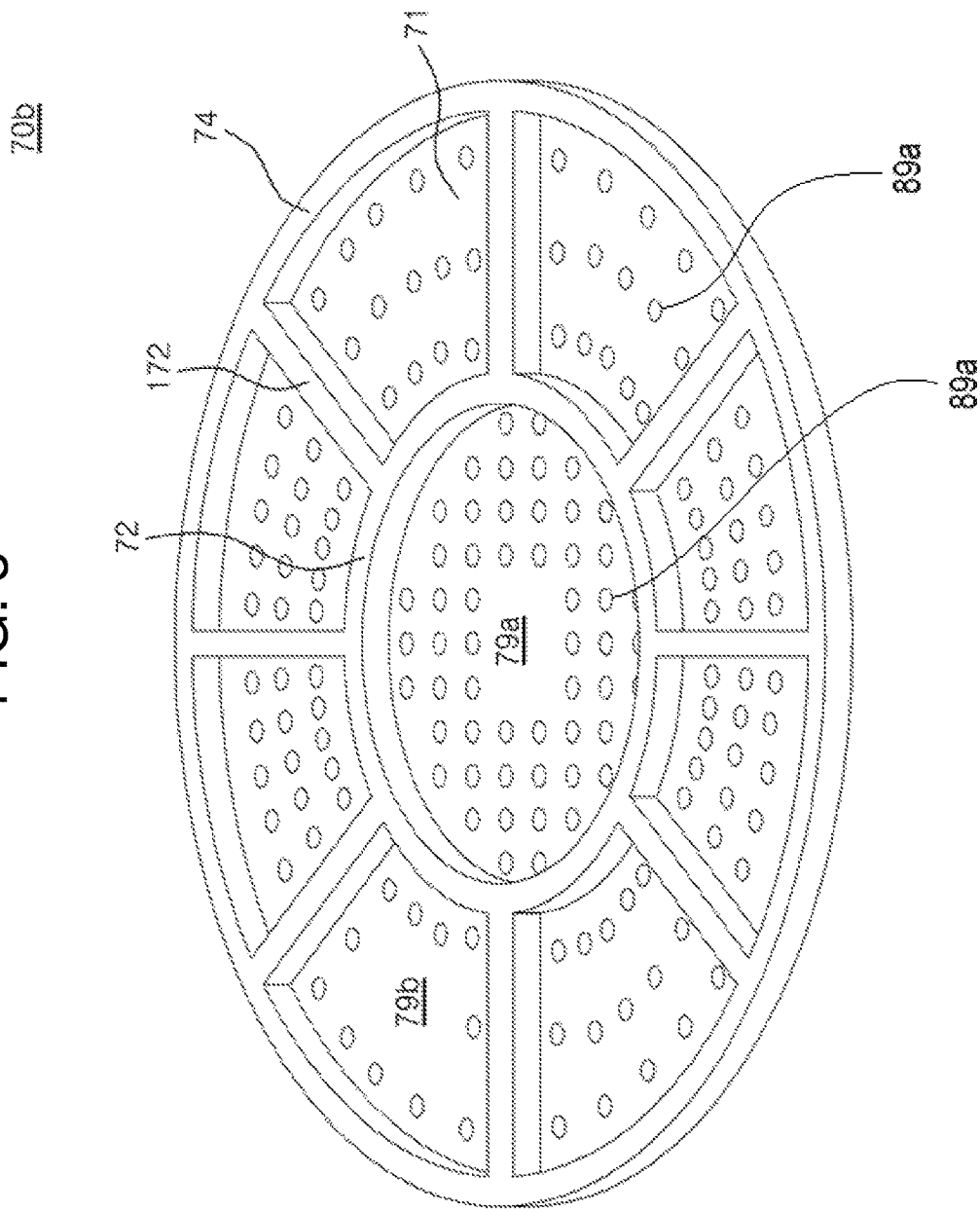
FIG. 3 is a perspective view of an upper partition member of FIG. 1.

FIG. 3 is a perspective view of an upper partition member of FIG. 1. As illustrated in FIG. 3, the upper partition member has an upper plate 71 having a circular plate. The upper plate 71 may have a plurality of upper through-holes 89a to allow the reaction gas supplied into the upper buffer space 87 to move to an upper side of the lower plate 73a. The upper inner partition member 72 may be disposed on a central portion of the upper plate 71 to partition a region of the upper plate 71 into an upper central region 79a and upper intermediate regions 79b. The upper flange 74 is disposed along an edge of the upper plate 71. Upper inner connection members 172 are disposed between the upper inner partition member 72 and the upper flange 74 in the radial direction with respect to the upper inner partition member 72. The upper inner connection members 172 may partition the upper plate 71 into upper intermediate regions 79b to block the upper intermediate regions 79b against each other. Also, the upper inner partition member 72 and the upper flange 74 are concentrically disposed.

As illustrated in FIG. 1, the upper partition member 70b is disposed on the lower partition member 70a. Thus, the upper buffer space is partitioned into the edge regions 79c defined between the lower flange 76 and the upper flange 74, the intermediate regions 79b and 75b defined between the upper flange 74 and the upper and lower inner partition members 72 and 78, and the central regions 79a and 75a defined inside the upper and lower inner partition members 72 and 78. Here, each of the spaces may communicate with the lower buffer space 77.

Gas supply ports 40a, 40b, 40c, and 40d are fixed to the upper chamber 20 to correspond to each of the diffusion regions. The edge gas supply ports 40a and 40d are disposed above the edge region 79c, and the intermediate gas supply ports 40b and 40c are disposed above the intermediate regions 79b and 75b. In the current embodiment, although the gas supply port is omitted above the central regions 79a and 75a, a separate gas supply port may be disposed above the central regions 79a and 75a. Each of the gas supply ports 40a, 40b, 40c, and 40d supplies the reaction gas into each of the diffusion regions. The supplied reaction gas may move into the lower buffer space 77 through the lower and upper partition members 70a and 70b to move into the inner space 3 through the injection holes 65.

Gas supply lines 42a, 42b, 42c, and 42d may be connected to the gas supply ports 40a, 40b, 40c, and 40d, respectively. The reaction gas may be supplied into each of the gas supply ports 40a, 40b, 40c, and 40d through the each of the gas supply lines 42a, 42b, 42c, and 42d. Flow rate adjustors 44a, 44b, 44c, and 44d may be respectively disposed in the gas supply lines 42a, 42b, 42c, and 42d to adjust an amount of supplied reaction gas. Here, each of the flow rate adjustors 44a, 44b, 44c, and 44d may be controlled by a controller 80.

In the current embodiment, although the plurality of through-holes are defined in each of the lower and upper plates 73a and 71, the present disclosure is not limited thereto. For example, the lower plate 73a and the upper plate 71 may be omitted as needed to define an opening having a fan shape. Here, the opening may have substantially the same shape as that of the diffusion region. The plurality of through-holes may be substituted with the opening.

Figure 5:
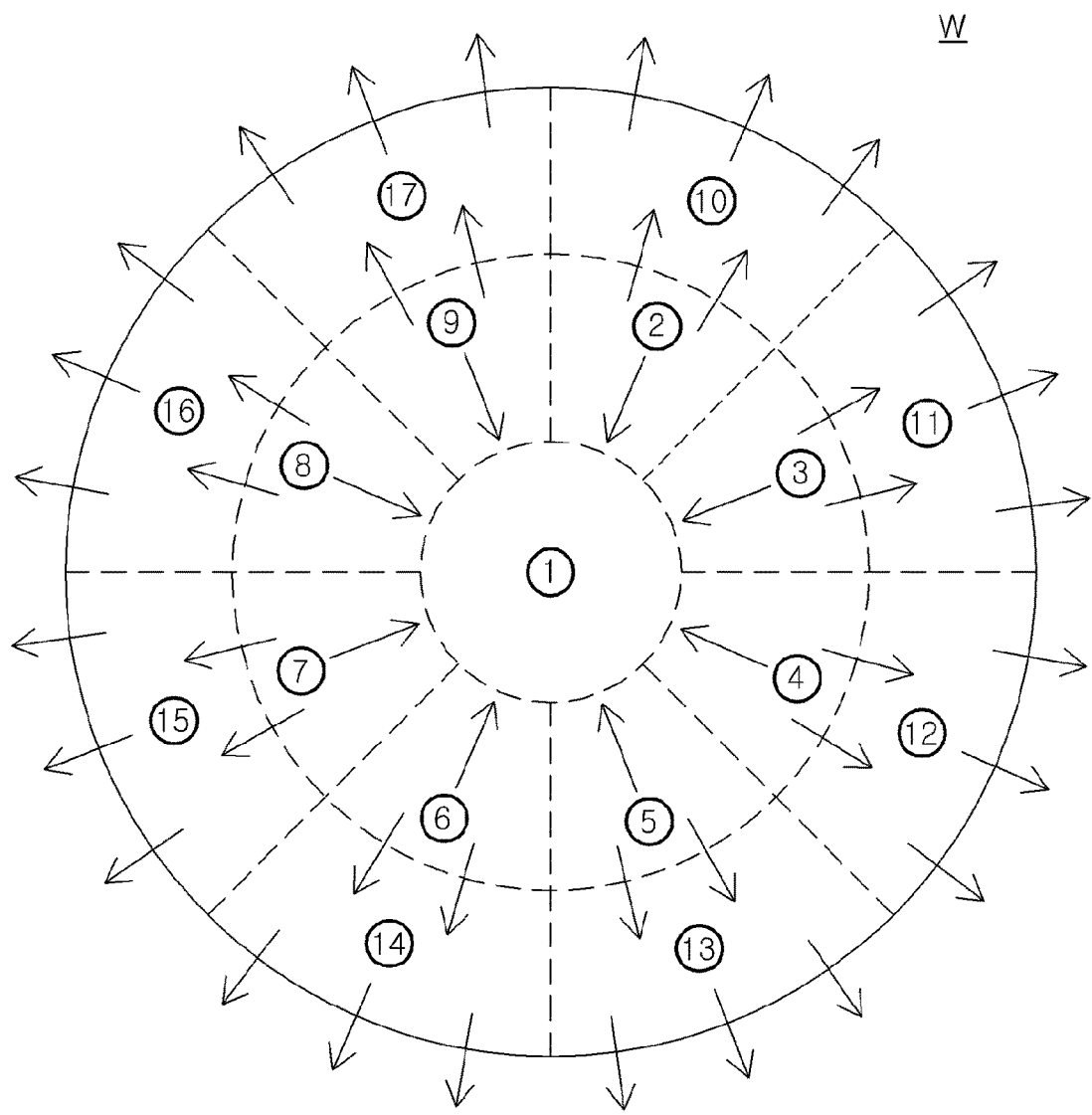
FIG. 5 is a schematic plan view illustrating a flow of the reaction gas on a substrate of FIG. 1.

FIG. 4 is a schematic view illustrating a flow of a reaction gas of the substrate processing apparatus of FIG. 1, and FIG. 5 is a schematic plan view illustrating a flow of the reaction gas on a substrate of FIG. 1. Hereinafter, a flow of the reaction gas will be described with reference to FIGS. 4 and 5.

As described above, the reaction gas may be supplied into each of the diffusion regions through each of the gas supply ports 40a, 40b, 40c, and 40d. Since the diffusion regions are blocked against each other in a radial direction of the showerhead 60, a movement of the reaction gas supplied into each of the diffusion regions into the other diffusion region may be prevented. Then, the reaction gas moves into the lower buffer space 77 through the lower partition member 70a to move to the surface of the substrate W through the injection holes 65.

Here, as illustrated in FIG. 5, the surface of the substrate W may be divided into virtual areas (for example, seventeen virtual areas). Each of the diffusion regions is disposed above each of the virtual areas. That is, the central sections 79a and 75a are disposed above an area ①, the middle sections 79b and 75b are disposed above areas ② to ⑨, and the edge sections 79c are disposed above areas ⑩ to ⑰. Thus, the reaction gas in the intermediate regions 79b and 75b is injected into each of the areas ② to ⑨ to move toward the central regions 75a and 75a and the edge regions 79c. Also, the reaction gas in the edge regions 79c is injected into each of the areas ⑩ to ⑰ to move toward the outside of the intermediate regions 79b and 75b and the substrate W. Here, although a portion of the reaction gases in the intermediate regions 79b and 75b and the edge regions 79c are mixed with each other in the lower buffer space 77, most of the reaction gases may be injected toward each of the areas as described above. Therefore, in the current embodiment of the present invention, the reaction gas supplied into the independent diffusion region may be injected into the corresponding area of the surface of the substrate W. Here, the amount of supplied reaction gas injected into each of the areas of the surface of the substrate W may be artificially adjusted to form a thin film having a uniform thickness.

In detail, the reaction gas injected through the injection holes 65 of the showerhead 30 is supplied to the upper portion of the substrate W. The reaction gas reacts with the surface of the substrate W to form the thin film in a state where the substrate W is heated by the susceptor 40. Here, the thin film may have a thickness that is proportional to an amount of supplied reaction gas injected through the injection holes 65. That is, a thin film having a relatively thin thickness is formed on a portion of the surface of the substrate W to which a small amount of reaction gas is supplied. Also, a thin film having a relatively thick thickness is formed on a portion of the surface of the substrate W to which a large amount of reaction gas is supplied. Therefore, when the reaction gas is uniformly supplied onto an entire surface of the substrate W, the thin film may have a uniform thickness.

However, the thin film has a thickness that increases or decreases in proportional to a heating temperature of the susceptor 30 in addition to the amount of the supplied reaction gas. Thus, the thin film formed on a portion of the surface of the substrate W corresponding to the susceptor 30 having a low heating temperature has a relatively thin thickness, and the thin film formed on a portion of the surface of the substrate W corresponding to the susceptor 30 having a high heating temperature has a relatively thick thickness. Thus, when the heating temperature of the susceptor 30 is uniform, the thin film may have a uniform thickness. Therefore, the susceptor 30 having entirely uniform heating temperature is ideal.

However, practically, it is impossible to manufacture the susceptor 30 having a perfectly uniform heating temperature. In particular, recently, the substrate W increases in size to increase a size of the susceptor 30. Thus, it is difficult to form uniform temperature dispersion on the substrate W. That is, while the substrate is heated to a process temperature, the heater may be broken or deteriorated in performance, and also the heater may emit locally non-uniform radiant heat. In addition, there are various factors affecting the thickness of the thin film. It is necessary to artificially adjust a portion of the above-described factors so as to form a thin film having a uniform thickness. Thus, in the current embodiment of the present invention, the amount of supplied reaction gas is artificially non-uniformly adjusted to form a thin film having a uniform thickness on an entire surface of the substrate W.

For example, a thin film is formed by using a dummy substrate W. Then, the thickness of the thin film is measured. Here, the supply amount of reaction gas supplied into the diffusion region may be adjusted, and thus the reaction gas may be uniformly injected onto entire area of the surface of the substrate. Then, the supply amount of the reaction gas supplied into each of the diffusion regions may be adjusted in proportional to the measured thickness of the thin film. That is, when the thin film has a thickness greater than a reference value on a certain area of the surface of the substrate W, the amount of reaction gas supplied into the diffusion region disposed above the corresponding area may be reduced. Also, when the thin film has a thickness less than a reference value on a certain area of the surface of the substrate W, the amount of reaction gas supplied into the diffusion region disposed above the corresponding area may increase. The above-described controller 80 may control the flow rate adjustors 44a, 44b, 44c, and 44d according to the measured thickness of the thin film to increase and decrease the amount of reaction gas supplied into each of the diffusion regions. For example, the above-described reference value may be an average value of the measured thickness of the thin film. The controller 80 may calculate the average value from the measured thickness of the thin film. When the process for adjusting the amount of reaction gas is performed a couple of times, the thin film having a uniform thickness may be formed. Then, the substrate W may be practically applied to later processes.

As illustrated in FIG. 1, a support member 88 is fixed to a sidewall of the lower chamber 10. The support member 88 includes a horizontal part and a vertical part. The horizontal part may be fixed to the sidewall of the lower chamber 10. The vertical part may extend upward from an inner end of the horizontal part. An exhaust ring 50 may be disposed between the flange part of the showerhead 60 and the support member 88 and be supported by the support member 88. The exhaust ring 50 is spaced apart form an inner sidewall of the lower chamber 10 to define an exhaust space between the exhaust ring 50 and the inner sidewall of the lower chamber 10. An exhaust passage 13 is defined in the sidewall of the lower chamber 10 to communicate with the exhaust space. An exhaust port 15 and an exhaust line 17 are connected to the exhaust passage 13. Thus, the non-reaction gases and the reaction byproducts generated when the thin film is formed may be forcibly suctioned through the exhaust pump 19 disposed on the exhaust line 17 to move into the exhaust space through a plurality of exhaust holes 53 defined in the exhaust ring 50, thereby being discharged to the outside through the exhaust passage 13, the exhaust port 15, and the exhaust line 17.

Although the present invention is described in detail with reference to the exemplary embodiments, the invention may be embodied in many different forms. Thus, technical idea and scope of claims set forth below are not limited to the preferred embodiments.

Mode for Invention

Figure 6:
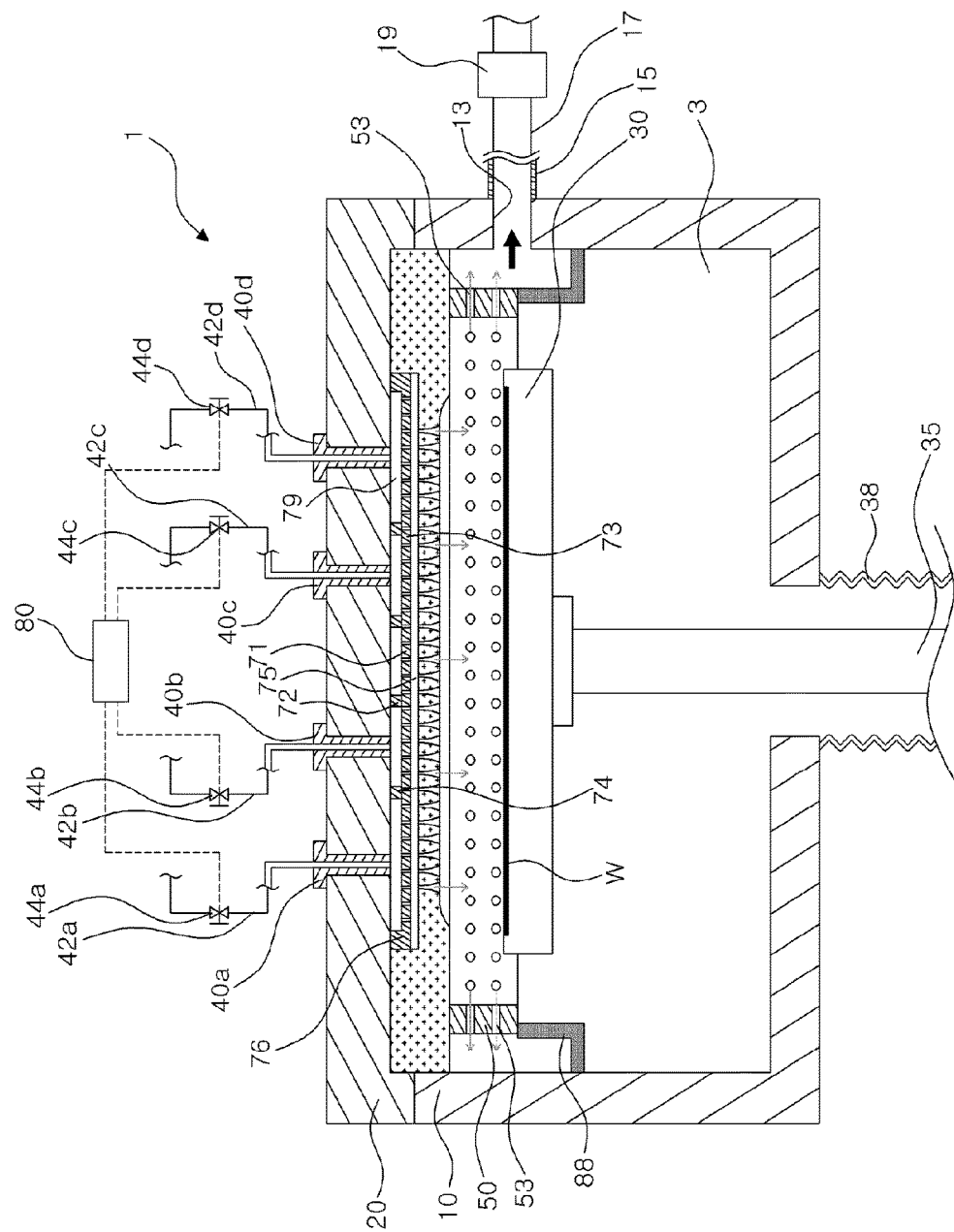
FIG. 6 is a schematic cross-sectional view of a substrate processing apparatus according to another embodiment of the present invention.
Figure 7:
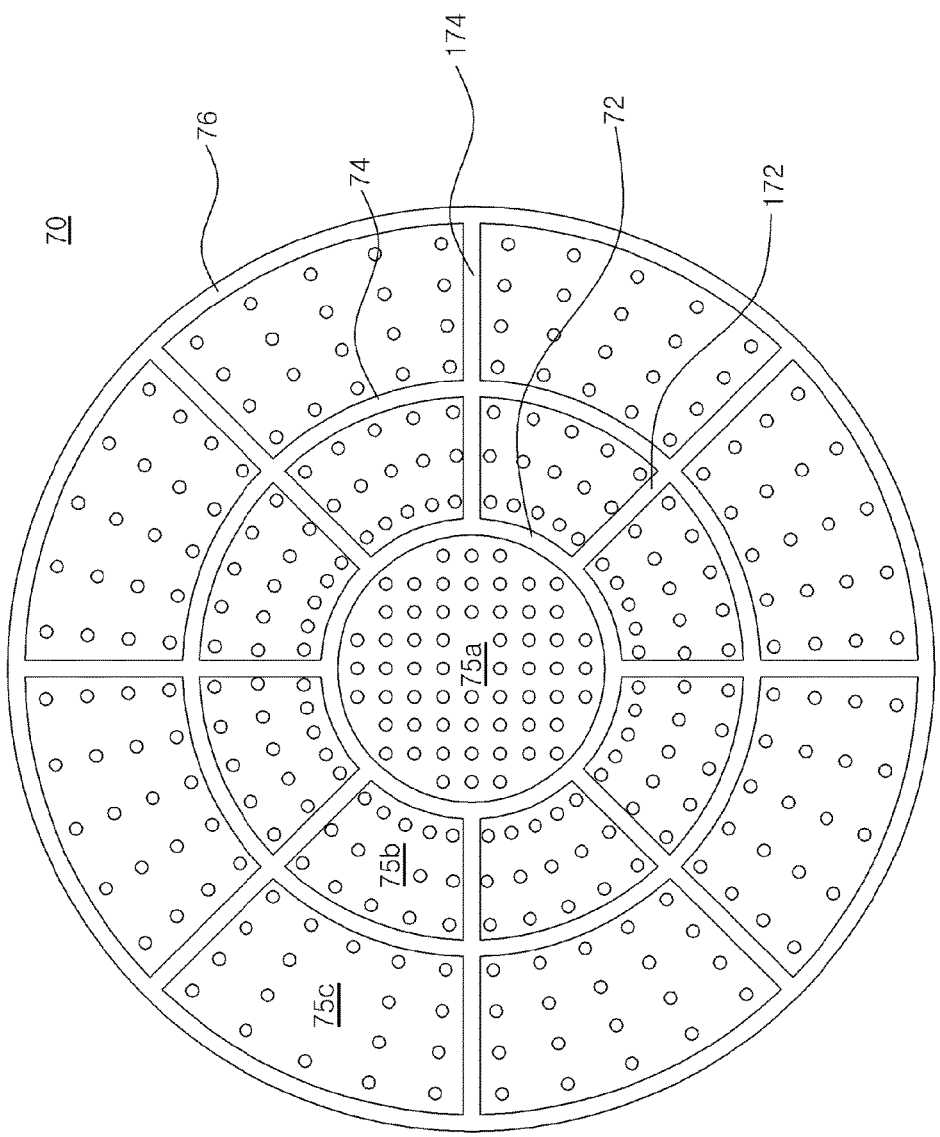
FIG. 7 is a perspective view of a partition member of FIG. 6.

FIG. 6 is a schematic cross-sectional view of a substrate processing apparatus according to another embodiment of the present invention, and FIG. 7 is a perspective view of a partition member of FIG. 6. Hereinafter, only configurations different from those according to the foregoing embodiment will be described. Thus, omitted descriptions herein may be substituted for the above-described contents.

As illustrated in FIGS. 6 and 7, a partition member 70 includes a lower plate 73 having a circular plate shape. The lower plate 73 may have a plurality of through-holes to allow the reaction gas supplied into an upper buffer space to move into a lower buffer space 75 through the through-holes. Each of upper and outer partition members 72 and 73 and a flange 76 have a ring shape and the same center. The inner and outer partition members 72 and 73 and the flange 76 are successively spaced apart from each other from a center of the lower plate 73 along a radial direction. The inner and outer partition members 72 and 74 and the flange 76 are disposed between a top surface of the lower plate 73 and an upper chamber 20 to define a central region 75a, intermediate regions 75b, and edge regions 75c. The central region 75a is defined inside the inner partition member 72. The intermediate regions 75b are defined between the inner partition member 72 and the outer partition member 74. Also, the edge regions 75c are defined between the outer partition member 74 and the flange 76.

Inner connection members 172 are disposed between the inner partition member 72 and the outer partition member 74 in a radial direction with respect to the inner partition member 72. The intermediate regions 75b are partitioned and blocked against each other by the inner connection members 172. Similarly, the outer connection members 174 are disposed between the outer partition member 74 and the flange 76 in the radial direction with respect to the inner partition member 72. The edge regions 75c are partitioned and blocked against each other by the outer connection members 174.

Figure 8:
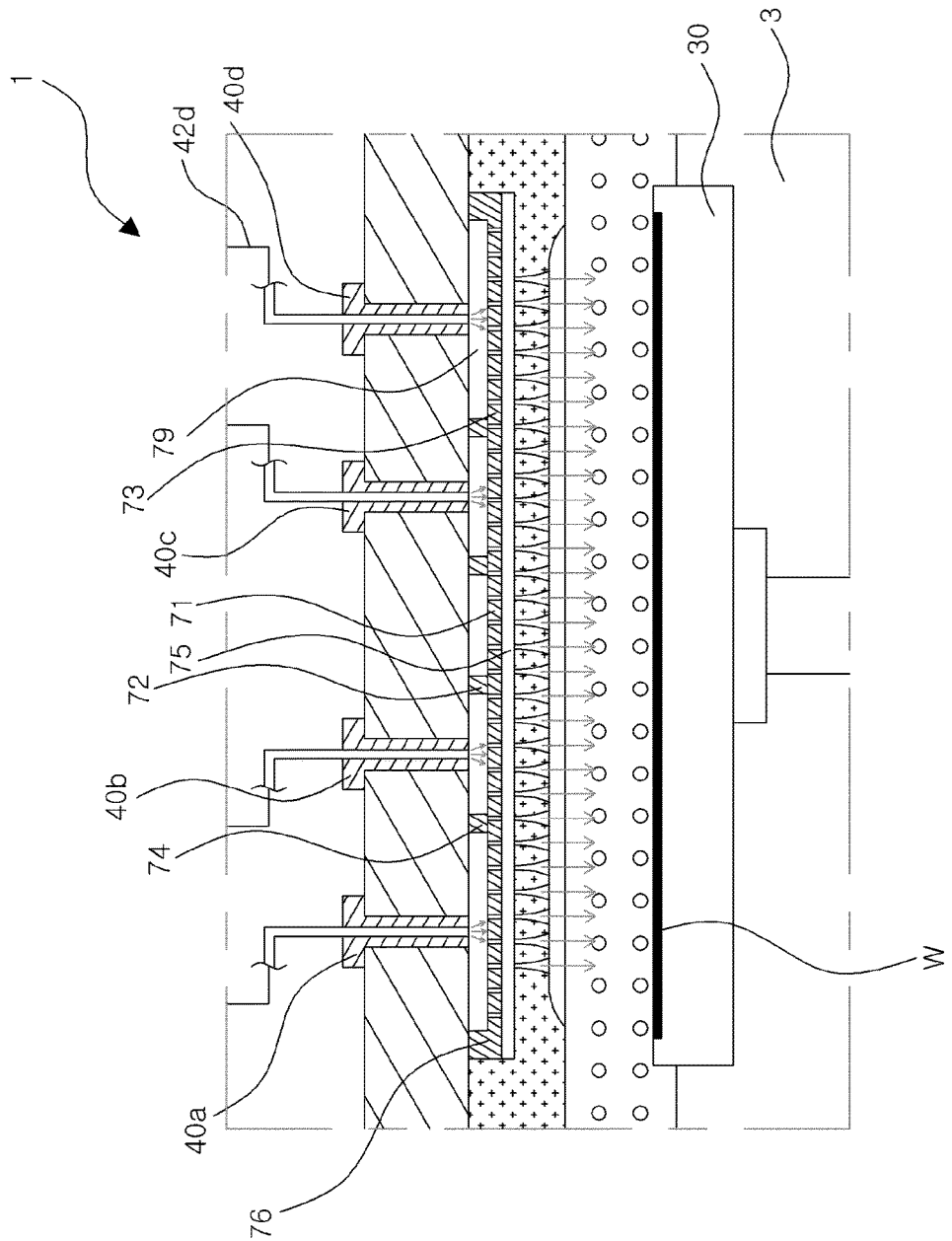
FIG. 8 is a schematic cross-sectional view illustrating a flow of a reaction gas of the substrate processing apparatus of FIG. 6.

FIG. 8 is a schematic cross-sectional view illustrating a flow of a reaction gas of the substrate processing apparatus of FIG. 6. As described above, the reaction gas may be supplied into each of the diffusion regions through each of the gas supply ports 40a, 40b, 40c, and 40d. Since the diffusion regions are blocked against each other in a radial direction of the showerhead 60, a movement of the reaction gas supplied into each of the diffusion regions into the other diffusion region may be prevented. Then, the reaction gas moves into the lower buffer space 75 through the partition member 70 to move to the surface of the substrate W through the injection holes 65.

INDUSTRIAL APPLICABILITY

The present invention may be applicable to a various apparatus for manufacturing semiconductor or a various method for manufacturing semiconductor.

What is claimed is:

1. A substrate processing apparatus comprising:
a lower chamber having an opened upper side;
an upper chamber opening or closing the upper side of the lower chamber, the upper chamber defining an inner space, in which a process is performed on a substrate, together with the lower chamber;
a susceptor disposed in the inner space and on which the substrate is placed;
a showerhead being disposed on a lower portion of the upper chamber and having a plurality of injection holes, wherein a buffer space is defined between the showerhead and the upper chamber so that a reaction gas supplied into the buffer space is supplied into the inner space through the injection holes;
a partition member disposed in the buffer space and spaced apart from a bottom of the buffer space to partition the buffer space into a plurality of diffusion regions, wherein the plurality of diffusion regions include a lower buffer space communicating with the injection holes and being positioned under the partition member to have a size substantially same as a diameter of the susceptor, and an upper buffer space being positioned above the lower buffer space, the upper buffer space being partitioned into a plurality of areas by the partition member; and
a plurality of gas supply ports disposed in the upper chamber to supply the reaction gas toward each of the plurality of areas of the upper buffer space,
wherein the lower buffer space communicates with the upper buffer space so that the reaction gas supplied into the plurality of areas of the upper buffer space moves into the lower buffer space, and the lower buffer space is configured such that the reaction gas from the plurality of areas of the upper buffer space is mixed with each other in the lower buffer space, and
wherein the plurality of areas include a central area and a plurality of edge areas surrounding the central area, the partition member blocks the edge areas from the central area, preventing the reaction gas from moving from the edge areas to the central area or from the central area to the edge areas,
wherein each of the plurality of edge areas is a shape of a fan such that a length of an inner arc that faces the central area is greater than a length of an outer arc opposite to the inner arc, and
wherein the gas supply ports are directly connected to a corresponding one of the plurality of areas of the upper buffer space which are blocked from each other.

2. A substrate processing apparatus comprising:
a lower chamber having an opened upper side;
an upper chamber opening or closing the upper side of the lower chamber, the upper chamber defining an inner space, in which a process is performed on a substrate, together with the lower chamber;
a susceptor disposed in the inner space and on which the substrate is placed;
a showerhead being disposed on a lower portion of the upper chamber and having a plurality of injection holes, wherein a buffer space is defined between the showerhead and the upper chamber so that a reaction gas supplied into the buffer space is supplied into the inner space through the injection holes;
a partition member disposed in the buffer space and spaced apart from a bottom of the buffer space to partition the buffer space into a plurality of diffusion regions, wherein the plurality of diffusion regions include a lower buffer space communicating with the injection holes and being positioned under the partition member to have a size substantially same as a diameter of the susceptor, and an upper buffer space being positioned above the lower buffer space, the upper buffer space being partitioned into a plurality of areas by the partition member; and
a plurality of gas supply ports disposed in the upper chamber to supply the reaction gas toward each of the plurality of areas of the upper buffer space,
wherein the lower buffer space communicates with the upper buffer space so that the reaction gas supplied into the plurality of areas of the upper buffer space moves into the lower buffer space, and the lower buffer space is configured such that the reaction gas from the plurality of areas of the upper buffer space is mixed with each other in the lower buffer space,
wherein the plurality of areas of the upper buffer space comprise a central area and a plurality of edge areas, and
the partition member comprises:
an inner partition member disposed on a circumference of the central area so as to be partitioned into the central area defined in the inside thereof and the edge areas defined in the outside thereof; and
a plurality of connection members connected to the outside of the inner partition member to block the edge areas against each other, preventing the reaction gas from moving from the edge areas to the central area or from the central area to the edge areas,
wherein each of the plurality of edge areas is a shape of a fan, and
wherein the gas supply ports are directly connected to a corresponding one of the plurality of areas of the upper buffer space which are blocked from each other.

3. The substrate processing apparatus of claim 2, wherein the plurality of gas supply ports are connected to the edge areas, respectively.

4. A substrate processing apparatus comprising:
a lower chamber having an opened upper side;
an upper chamber opening or closing the upper side of the lower chamber, the upper chamber defining an inner space, in which a process is performed on a substrate, together with the lower chamber;
a susceptor disposed in the inner space and on which the substrate is placed;
a showerhead being disposed on a lower portion of the upper chamber and having a plurality of injection holes, wherein a buffer space is defined between the showerhead and the upper chamber so that a reaction gas supplied into the buffer space is supplied into the inner space through the injection holes;
a partition member disposed in the buffer space and spaced apart from a bottom of the buffer space to partition the buffer space into a plurality of diffusion regions, wherein the plurality of diffusion regions include a lower buffer space communicating with the injection holes and being positioned under the partition member to have a size substantially same as a diameter of the susceptor, and an upper buffer space being positioned above the lower buffer space, the upper buffer space being partitioned into a plurality of areas by the partition member; and a plurality of gas supply ports disposed in the upper chamber to supply the reaction gas toward each of the plurality of areas of the upper buffer space, wherein the lower buffer space communicates with the upper buffer space so that the reaction gas supplied into the plurality of areas of the upper buffer space moves into the lower buffer space, and the lower buffer space is configured such that the reaction gas from the plurality of areas of the upper buffer space is mixed with each other in the lower buffer space, wherein the plurality of areas of the upper buffer space comprise a central area, a plurality of intermediate areas, and a plurality of edge areas, and the partition member comprises:

an inner partition member disposed on a circumference of the central area so as to be partitioned into the central area defined in the inside thereof and the intermediate areas defined in the outside thereof, preventing the reaction gas from moving from the central area to the intermediate areas or from the intermediate areas to the central area;

a plurality of inner connection members connected to an outside of the inner partition member to block the intermediate areas against each other;

an outer partition member spaced apart from a circumference of the inner partition member so as to be partitioned into the intermediate areas defined inside thereof and the edge areas defined outside thereof, preventing the reaction gas from moving from the intermediate areas to the edge areas or from the intermediate areas to the edge areas; and a plurality of outer connection members connected to the outside of the outer partition member to block the edge areas against each other, wherein each of the plurality of edge areas is a shape of a fan, and wherein the gas supply ports are directly connected to a corresponding one of the plurality of areas of the upper buffer space which are blocked from each other.

5. The substrate processing apparatus of claim 4, wherein the plurality of gas supply ports are connected to the edge areas and the intermediate areas, respectively.

6. The substrate processing apparatus of claim 1, further comprising:

a plurality of gas supply lines each of which is connected to the gas supply port to supply the reaction gas;

a plurality of flow rate adjustors each of which opens or closes the gas supply line; and a controller connected to the flow rate adjustor to adjust a supply amount of the reaction gas through the gas supply line.

7. The substrate processing apparatus of claim 6, wherein the controller controls the flow rate adjustors so that a supply amount of reaction gas supplied to one of the gas supply lines is different from that of reaction gas supplied to the other of the gas supply lines.

8. The substrate processing apparatus of claim 1, further comprising:

an exhaust ring spaced apart from the lower chamber along a sidewall of the lower chamber, the exhaust ring having a plurality of exhaust holes defined above the susceptor; and a support member fixed to the sidewall of the lower chamber to support the exhaust ring, wherein an exhaust space is defined between the sidewall of the lower chamber and the exhaust ring to communicate with an exhaust port in the sidewall of the lower chamber.

9. The substrate processing apparatus of claim 1, wherein the plurality of diffusion regions comprise a central region and a plurality of edge regions, wherein the central region has a lower central region and an upper central region positioned above the lower central region, the upper central region and the edge regions are positioned at the same height, the upper central region being the central area of the upper buffer space, the edge regions being the edge areas of the upper buffer space.

10. The substrate processing apparatus of claim 1, wherein the plurality of diffusion regions comprise a central region, a plurality of intermediate regions, and a plurality of edge regions, wherein the central region has a lower central region and an upper central region positioned above the lower central region, the intermediate region has a lower intermediate region and an upper intermediate region positioned above the lower intermediate region, the upper central region, the intermediate regions, and the edge regions are positioned at the same height, the upper central region being the central area of the upper buffer space, the edge regions being the edge areas of the upper buffer space.

11. The substrate processing apparatus of claim 10, the partition member includes a lower partition member and an upper partition member disposed on the lower partition member, the lower partition member includes:

a lower plate having a circular plate shape and having a plurality of lower through-holes to allow the reaction gas supplied into the upper buffer space to move into the lower buffer space through the lower through-holes, a circular recess part being recessed from a top surface of the lower plate;

a lower inner partition member disposed in the recess part to partition a space of the recess part into the circular lower central region and the lower intermediate regions, the lower intermediate regions defined in the outside of the lower central region;

a plurality of lower inner connection members extending radially from an outer circumferential surface of the lower inner partition member to partition the space of the recess part into the lower intermediate regions, so that the lower intermediate regions are isolated from each other;

a lower flange disposed along an edge of the lower plate to protrude a top surface of the lower plate; and a plurality of lower outer connection members extending from an inner sidewall of the lower flange toward the center of the lower inner partition member in the radial direction, the edge regions are isolated from each other by the lower outer connection members, the upper partition member includes:

the upper plate having a circular plate shape and having a plurality of upper through-holes;

an upper inner partition member disposed on a central portion of the upper plate to isolate the upper central region from the upper intermediate regions, the upper intermediate regions defined in the outside of the upper central region;
an upper flange disposed along an edge of the upper plate to protrude a top surface of the upper plate; and
a plurality of upper inner connection members disposed between the upper inner partition member and the upper flange in the radial direction with respect to the upper inner partition member to isolate the upper intermediate regions from each other.

\* \* \* \* \*